US012663492B2

(12) United States Patent
Alsop

(10) Patent No.: US 12,663,492 B2
(45) Date of Patent: Jun. 23, 2026

(54) SYSTEMS AND METHODS FOR NON-SELECTIVE STIMULATED ECHO MULTISLICE DIFFUSION IMAGING

(71) Applicant: Beth Israel Deaconess Medical Center, Inc., Boston, MA (US)

(72) Inventor: David Alsop, Newton, MA (US)

(73) Assignee: BETH ISRAEL DEACONESS MEDICAL CENTER, INC., Boston, MA (US)

( * ) Notice: Subject to any disclaimer, the term of this patent is extended or adjusted under 35 U.S.C. 154(b) by 152 days.

(21) Appl. No.: 18/555,577

(22) PCT Filed: Apr. 18, 2022

(86) PCT No.: PCT/US2022/071766
§ 371 (c)(1),
(2) Date: Oct. 16, 2023

(87) PCT Pub. No.: WO2022/221884
PCT Pub. Date: Oct. 20, 2022

(65) Prior Publication Data
US 2024/0201302 A1 Jun. 20, 2024

Related U.S. Application Data

(60) Provisional application No. 63/176,047, filed on Apr. 16, 2021.

(51) Int. Cl.
*G01V 3/00* (2006.01)
*G01R 33/483* (2006.01)
(Continued)

(52) U.S. Cl.
CPC ... *G01R 33/56341* (2013.01); *G01R 33/4835* (2013.01); *G01R 33/543* (2013.01);
(Continued)

(58) Field of Classification Search
CPC .............. G01R 33/287; G01R 33/4835; G01R 33/5608; A61B 2090/374
(Continued)

(56) References Cited

U.S. PATENT DOCUMENTS 4,748,409 A 5/1988 Frahm et al.
2012/0286777 A1 11/2012 Frost et al.
(Continued)

FOREIGN PATENT DOCUMENTS

CN 1530072 A * 9/2004 ............ C02F 1/4672
CN 101066207 A * 11/2007
(Continued)

OTHER PUBLICATIONS

JP-2005515809-A (Philips) (Year: 2005).*
(Continued)

*Primary Examiner* — Walter L Lindsay, Jr.
*Assistant Examiner* — Frederick Wenderoth
(74) *Attorney, Agent, or Firm* — Quarles & Brady, LLP

(57) ABSTRACT

Systems and methods are provided for producing diffusion-weighted images of a subject using a magnetic resonance imaging (MRI) system. The method includes performing a stimulated echo preparation module using non-selective radio-frequency (RF) pulses designed to induce a stimulated echo, performing an acquisition module that includes a multi-slice acquisition of MR data in the presence of diffusion gradients, and reconstructing the diffusion-weighted images of the subject from the MR data.

24 Claims, 3 Drawing Sheets

(51) Int. Cl.

| | | |
|---|---|---|
| *G01R 33/54* | (2006.01) |
| *G01R 33/56* | (2006.01) |
| *G01R 33/561* | (2006.01) |
| *G01R 33/563* | (2006.01) |
| *G01R 33/567* | (2006.01) |

(52) U.S. Cl.

CPC ..... *G01R 33/5607* (2013.01); *G01R 33/5615* (2013.01); *G01R 33/567* (2013.01)

(58) Field of Classification Search

USPC ......................................................... 324/309

See application file for complete search history.

(56) References Cited

U.S. PATENT DOCUMENTS

| | | | |
|---|---|---|---|
| 2016/0231410 A1 | 8/2016 | Warfield et al. | |
| 2016/0334489 A1* | 11/2016 | Sperl ................. | G01R 33/5608 |
| 2018/0136297 A1 | 5/2018 | Koch et al. | |
| 2019/0265321 A1 | 8/2019 | Alsop et al. | |
| 2019/0317168 A1* | 10/2019 | Popescu .......... | G01R 33/56563 |
| 2019/0377050 A1 | 12/2019 | Ennis et al. | |

FOREIGN PATENT DOCUMENTS

| | | | | | |
|---|---|---|---|---|---|
| CN | 104870982 A | * | 8/2015 | ........... | G01N 21/274 |
| CN | 108520088 A | * | 9/2018 | ............. | G01N 24/08 |
| EP | 3336570 A1 | * | 6/2018 | ......... | G01R 33/5616 |
| JP | 2005515809 A | * | 6/2005 | ............. | A61B 5/055 |
| JP | 5172170 B2 | * | 3/2013 | | |
| WO | WO-2019231427 A1 | * | 12/2019 | ....... | G01R 33/56341 |

OTHER PUBLICATIONS

JP-5172170-B2 (Toshiba) (Year: 2013).*

International Search Report and Written Opinion of related PCT/US2022/071766, mailed on Jun. 16, 2022.

Edelman, Robert R., et al. "In vivo measurement of water diffusion in the human heart." Magnetic resonance in medicine 32.3 (1994): 423-428.

Frahm, Jens, et al. "Stimulated echo imaging." Journal of Magnetic Resonance (1969) 64.1 (1985): 81-93.

Fritz, F. J., Benedikt A. Poser, and Alard Roebroeck. "MESMERISED: Super-accelerating T1 relaxometry and diffusion MRI with STEAM at 7 T for quantitative multi-contrast and diffusion imaging." Neuroimage 239 (2021): 118285. pp. 1-19.

Lau, Angus Z., et al. "Accelerated human cardiac diffusion tensor imaging using simultaneous multislice imaging." Magnetic resonance in medicine 73.3 (2015): 995-1004.

Mekkaoui et al., "Diffusion Tractography of the Entire Left Venricle by Using Fred-breathing Accelerated Simultaneous Multisection Imaging," Radiology: vol. 282: No. 3—Mar. 2017.

Nolte, Ulrike G., et al. "Rapid isotropic diffusion mapping without susceptibility artifacts: whole brain studies using diffusion-weighted single-shot STEAM MR imaging." Magnetic Resonance in Medicine: An Official Journal of the International Society for Magnetic Resonance in Medicine 44.5 (2000): 731-736.

Stoeck, Christian T., et al. "Dual-phase cardiac diffusion tensor imaging with strain correction." PloS one 9.9 (2014): e107159: 1-12.

Voit, D., et al. (2021). Diffusion-weighted magnetic resonance imaging (MRI) without susceptibility artifacts: single-shot stimulated echo acquisition mode (STEAM) MRI with iterative reconstruction and spatial regularization. Quantitative imaging in medicine and surgery, 11(2), 831-837. https://doi.org/10.21037/qims-20-871.

Partial European Search Report issued in corresponding EP Application No. 22789140.5, dated Apr. 1, 2026.

* cited by examiner

SYSTEMS AND METHODS FOR NON-SELECTIVE STIMULATED ECHO MULTISLICE DIFFUSION IMAGING

CROSS-REFERENCE TO RELATED APPLICATIONS

This application represent the U.S. national stage entry of International Application Serial No. PCT/US2022/071766, filed Apr. 14, 2022, which claims priority to U.S. Provisional Application Ser. No. 63/176,047, filed Apr. 16, 2021, and entitled "SYSTEMS AND METHODS FOR NON-SELECTIVE STIMULATED ECHO MULTISLICE DIFFUSION IMAGING." The contents of each of these applications are incorporated herein by reference in their entirety.

STATEMENT REGARDING FEDERALLY SPONSORED RESEARCH

N/A

BACKGROUND

The disclosure relates to systems and methods for magnetic resonance imaging ("MRI"). More particularly, present disclosure provides systems and methods for non-selective, stimulated-echo, multi-slice MRI.

MRI uses the nuclear magnetic resonance ("NMR") phenomenon to produce images. When a substance such as human tissue is subjected to a uniform magnetic field, such as the so-called main magnetic field, $B_0$, of an MRI system, the individual magnetic moments of the nuclei in the tissue attempt to align with this $B_0$ field, but precess about it in random order at their characteristic Larmor frequency, $\omega$. If the substance, or tissue, is subjected to a so-called excitation electromagnetic field, $B_1$, that is in the plane transverse to the $B_0$ field and that has a frequency near the Larmor frequency, the net aligned magnetic moment, referred to as longitudinal magnetization, may be rotated, or "tipped," into the transverse plane to produce a net transverse magnetic moment, referred to as transverse magnetization. A signal is emitted by the excited nuclei or "spins," after the excitation field, $B_1$, is terminated, and this signal may be received and processed to form an image.

When utilizing these "MR" signals to produce images, magnetic field gradients (Gx, Gy, and Gz) are employed for spatial encoding. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

Depending upon the imaging parameters selected, the acquired data can be weighted toward a particular contrast mechanism. Diffusion-weighted MRI is a technique that makes images sensitive to microscopic diffusive motion of water within tissue. Diffusion is sensitive in general to the mobility of water, but is especially sensitive to restrictive boundaries to motion such as cell walls and the relative size and geometry of the extracellular space. Diffusion MRI can detect acute stroke because the extracellular space shrinks as a result of the associated energy failure. It also can measure the direction of fibers, especially white matter tracts in the brain, and damage associated with axonal loss or dysmyelination. More recently, the sensitivity of diffusion to cellularity has been used to detect and characterize cancerous lesions in both whole body screening and local imaging applications.

Despite the variety of important, clinical uses for diffusion imaging, it suffers from a number of challenges. For example, motion can be particular challenging to delivering clinically-useful data. In particular, diffusion-related motion is very small, on the scale of tens of microns, relative to bulk patient motion or even clinical physiological motion. Thus, any motion, and particularly any motion that could be considered "macroscopic motion" relative to micro-level measurements, leads to large phase shifts of the acquired MRI signal.

If the phase shifts are uniform in the tissue, reflecting bulk motion, then single shot imaging, especially echo planar imaging (EPI), can be used and the motion-related phase shifts do not affect the magnitude of the image. However, some motion, especially cardiac related pulsations, cause shear and compressive signal loss, especially in the heart, the left lobe of the liver, and in the spinal cord. EPI is also vulnerable to spatial distortion caused by non-uniform magnetic fields and eddy currents from diffusion gradients and artifacts from the frequency offset in fat.

Some have developed techniques that seek to still deliver clinically-usable images in the face of nonuniform magnetic fields and eddy currents. For example, resulting distortions can be reduced with parallel imaging and especially by reducing the field of view to just the tissue of interest, while suppressing the surrounding tissues with special strategies. However, by layering such imaging techniques, the acquisition times can be extended, which provides greater opportunities for motion corruption, and the applied RF power can be increased, which must be limited.

As another example, fat artifacts can be removed by suppressing fat, but non-uniform fields make consistent fat suppression challenging, especially outside the brain. Since diffusion of fat is very low, even a small error in suppression can cause problems in diffusion of the body. Large volume diffusion MRI of the body for metastasis detection often resorts to frequency insensitive short time inversion recovery (STIR) suppression, but this greatly reduces sensitivity and affects imaging speed.

As yet one further example, spin echo (SE), echo planar diffusion imaging is the pulse sequence that is often employed for DWI. However, the application and pulse sequence require a relatively long echo time (TE). In tissues with a shorter T2 relaxation time, this reduces sensitivity to T2 contrast. With this challenge in mind, MR systems have been developed that have very-strong diffusion gradients, which allow the TE to be shortened, but this shorter diffusion time reduces sensitivity to tissue microstructure. Strong diffusion gradients also introduce large eddy current artifacts, concomitant field errors, and raise the cost of scanner systems.

Some have used stimulated echo acquisition mode (STEAM) pulse sequences for diffusion-weighted imaging as an alternative to the more-common spin echo (SE) diffusion methods, such as SE EPI. Unfortunately, STEAM-based DWI also has shortcomings that limit its clinical utility. In STEAM-based sequences, three 90° RF pulses are used to create an echo. During the time between the second and third pulse, the signal decays with the T1 relaxation constant, instead of the much-shorter T2 relaxation time. Thus, longer diffusion times, which are more sensitive to boundaries, can be used. If the diffusion time is made equal to the cardiac rate, typically with cardiac gating, the signal loss from cardiac pulsations is eliminated. The longer diffusion times also reduce the demands on diffusion gradient strength and duty cycle, and minimize the T2 decay. Since fat T1 is short, the long diffusion times also attenuate the fat signal. Thus, STEAM pulse sequences provide a variety of advantages over SE EPI sequences.

However, despite these advantages of STEAM pulse sequences for DWI, clinical use has been limited due to a variety of other challenges. For example, SWI imaging using STEAM pulse sequences does suffer from reduced signal-to-noise ratio (SNR) compared to SE EPI echoes because the STEAM echo is half the amplitude of a spin echo. This relative SNR loss can be somewhat offset by reduced T2 decay when imaging tissues with relatively short T2 relaxation times. However, even if the reduced SNR can be managed, the acquisition times can be extended beyond desired lengths, for example, due to the addition of fat suppression to the STEAM pulse sequence. Even if the duration of the acquisition can be tolerated, STEAM pulse sequences suffer from challenges with controlling the field of view. Finally, even if all of these challenges are tolerated or managed, STEAM pulse sequences yield long diffusion times, which can lead to motion out of plane that causes signal loss. Thus, even if one or more of these challenges with using STEAM pulse sequences for DWI can be managed, the compounding challenges can undermine the potential advantages of using a STEAM pulse sequence. Thus, as stated, STEAM pulse sequences have found limited use in clinical applications.

Thus, there remains a need to provide systems and methods for improved diffusion weighted imaging using MRI.

SUMMARY

The present disclosure overcomes the aforementioned drawbacks by providing systems and methods for diffusion weighted imaging (DWI) using stimulated echo pulse sequences. More particularly, a non-slice selective stimulated echo preparation technique is combined with a multi-slice acquisition to overcomes the above-listed challenges facing the clinical use of STEAM pulse sequences for DWI. Thus, the systems and methods provided herein enable multi-slice acquisitions at high speed, while preserving these and additional advantages of a STEAM pulse sequence.

In accordance with one aspect of the disclosure, a method is provided for producing diffusion-weighted images of a subject using a magnetic resonance imaging (MRI) system. The method includes performing a stimulated echo preparation module using non-slice-selective radio-frequency (RF) pulses designed to induce a stimulated echo, performing an acquisition module that includes a multi-slice acquisition of MR data in the presence of diffusion gradients, and reconstructing the diffusion-weighted images of the subject from the MR data.

In accordance with another aspect of the disclosure, a magnetic resonance imaging (MRI) system is provided that includes a magnet system configured to generate a static magnetic field (B0) about at least a portion of a subject arranged in the MRI system and a plurality of gradient coils configured to apply magnetic gradients to the static magnetic field. The system also includes a radio frequency (RF) system configured to apply an excitation field to the subject and acquire MR image data from the subject and a computer system. The computer system is programmed to control the gradient coils and the RF system to perform a stimulated echo preparation module using non-selective radio-frequency (RF) pulses designed to induce a stimulated echo and perform an acquisition module that includes a multi-slice acquisition of MR data in the presence of diffusion gradients. The computer system is also programmed to reconstruct the diffusion-weighted images of the subject from the MR data.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
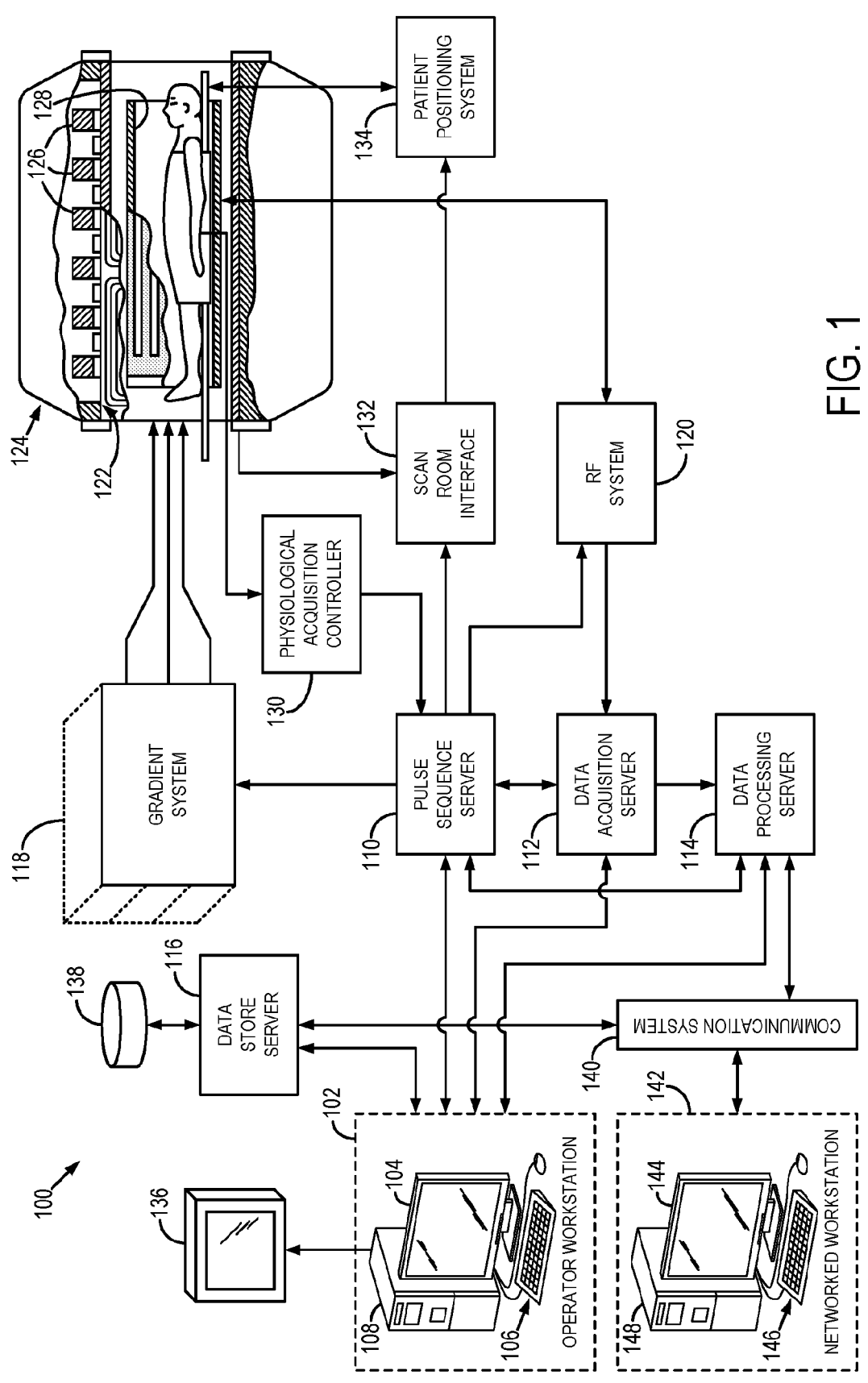
FIG. 1 is a block diagram of an exemplary magnetic resonance imaging (MRI) system configured in accordance with the present disclosure.

Referring now to FIG. 1, a magnetic resonance imaging (MRI) system 100 is provided that may be configured, programmed, or otherwise utilized in accordance with the present disclosure. The MRI system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency (RF) system 120. Gradient waveforms to perform the prescribed scan are produced and applied to the gradient system 118, which excites gradient coils in an assembly 122 to produce the magnetic field gradients Gx, Gy, Gz used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. Each RF receiver channel includes an RF preamplifier that amplifies the magnetic resonance signal received by the coil 128 to which it is connected, and a detector that detects and digitizes the I/and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} ;\qquad \text{Eqn. 1}$$

and the phase of the received magnetic resonance signal may also be determined according to the following relationship:

$$\varphi = \tan^{-1}\left(\frac{Q}{I}\right).\qquad \text{Eqn. 2}$$

The pulse sequence server 110 also optionally receives patient data from a physiological acquisition controller 130. By way of example, the physiological acquisition controller 130 may receive signals from a number of different sensors connected to the patient, such as electrocardiogram (ECG) signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data are lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data are acquired and used to calibrate the pulse sequence performed by the pulse sequence server 110.

As another example, navigator signals may be acquired and used to adjust the operating parameters of the RF system 120 or the gradient system 118, or to control the view order in which k-space is sampled.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; and so on.

Images reconstructed by the data processing server 114 are conveyed back to the operator workstation 102. Images may be output to operator display 112 or a display 136 that is located near the magnet assembly 124 for use by attending clinician. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be processed remotely by a networked workstation 142. This data may be exchanged in any suitable format, such as in accordance with the transmission control protocol (TCP), the internet protocol (IP), or other known or suitable protocols.

Figure 2:
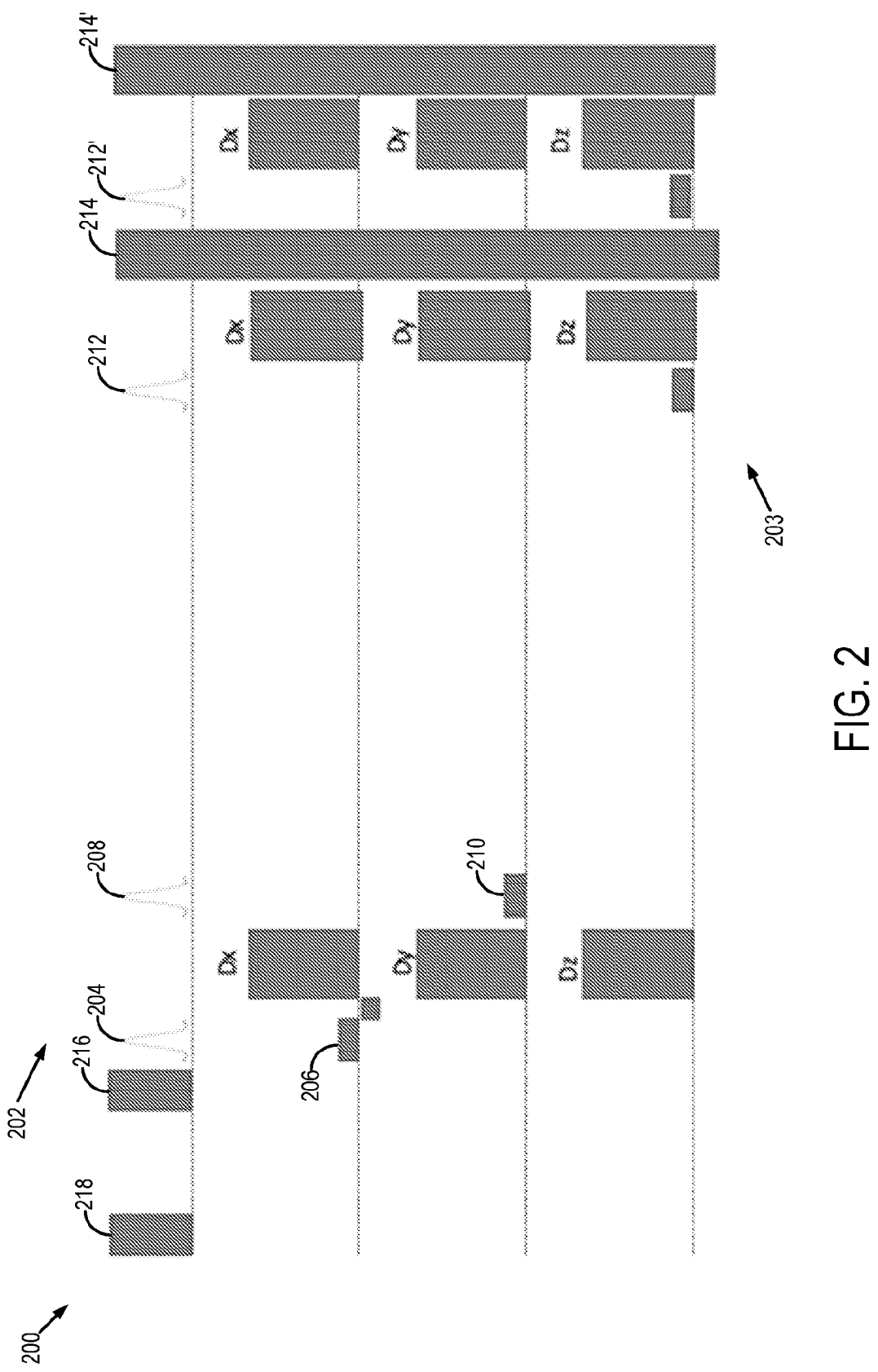
FIG. 2 is a pulse sequence diagram illustrating one, non-limiting example of a pulse sequence in accordance with the present disclosure that can be performed using the system of FIG. 1.

Referring now to FIG. 2, a pulse sequence 200 for use with the system of FIG. 1, for example, to perform diffusion weighted imaging (DWI), is illustrated. As will be described, the pulse sequence 200 includes a non-selective STEAM preparation module 202 and multi-slice acquisition module 203. Traditionally, STEAM-based pulse sequences were formed of three RF pulses. The first RF pulse could be generally characterized as a general "excitation" pulse that flips the spins into the transverse plane to undergo T2 relaxation. The second pulse could be characterized as a "storing" pulse because it seeks to "store" some of the total magnetization of the spins in the longitudinal axis to experience T1 relaxation over a mixing time (TM), whereas the remaining energy generates spin echoes. Finally, the third pulse could be thought of as a "recalling" pulse because it seeks to "recall" the stored magnetization to the transverse plane to again experience T2 relaxation and, ultimately, generate a "stimulated" echo. Thus, a STEAM module works to create multiple spin echoes, and also a stimulated echo. The spin echoes primarily undergo T2 decay, whereas the stimulated echo undergoes T1 and T2 decay.

Though non-selective STEAM pulse sequences have been employed for one or a few slices in cardiac diffusion imaging, the potential for large volume acquisition has not previously been appreciated. Furthermore, as will be described, the non-selective STEAM preparation module 202 of the present disclosure enables a number of ready options for fat suppression and reduced field of view imaging, that may be of particular value in spinal cord and body applications. A strategy to correct for differences in diffusion weighting across slices is also provided.

The present disclosure recognizes a variety of advantageous features of STEAM-based pulse sequences applied to diffusion imaging. For example, a slower, T1 decay during mixing times (TM) means that a STEAM-based pulse sequence can probe a wide range of diffusion times and achieve very large diffusion weightings with modest gradient amplitudes and duty cycles. As will be explained, STEAM-based pulse sequences also offer reduced T2 sensitivity and greater suppression of short T1 fat than spin echo imaging. Finally, cardiac gating of STEAM gradients can be used to extensively control cardiac motion related signal loss that is otherwise a problem when seeing to image the myocardium, regions of the liver, and even the spinal cord.

With these noted advantages, the present disclosure also recognizes that past attempts to use STEAM-based pulse sequences for diffusion-weighted acquisitions across large volumes suffer from long acquisition times because a limited number of slices can be acquired for each STEAM TM period.

The present disclosure recognizes that a non-selective STEAM preparation can be combined with a multi-band and/or multi-slice acquisition to acquire a large number of diffusion encoded slices in a short time. A multi-slice echo planar imaging (EPI) acquisition may be to acquire a large number of slices, essentially a whole volume, after a single excitation. The EPI acquisition may be a gradient echo EPI acquisition. Irrespective of the particular configuration of the acquisition module 203, in accordance with the present disclosure, a nonselective (except for potentially spatial selection to reduce field of view and frequency selection to eliminate fat) STEAM-based preparation module 202 is provided that is then followed by multiple-slice acquisition module 203. As will be described, this coverage can be assisted by parallel imaging acceleration of echo planar, and acquisition times can even be further reduced by the inclusion of multiband excitation.

A first RF excitation pulse 204 is either non-selective or, optionally, a gradient, 206, in one of the non-slice directions makes the sequence selective perpendicular to the slice direction, which is the "z-direction" in this non-limiting example. In doing so, the pulse sequence 200 advantageously includes a reduced imaging field of view (FOV). A second RF excitation pulse 208 converts the transverse magnetization to the longitudinal direction, where it decays more slowly with the T1 relaxation time, rather than the T2 relaxation time. The second RF pulse 208 can be either non-selective or, optionally, a gradient 210 can be applied to make the second RF pulse 208 weakly selective perpendicular to the slice direction (z-direction in this non-limiting example), to reduce the imaging field of view. A third RF excitation pulse 212 excites one slice (or, optionally, more than one slice, if performing a multi-band acquisition) is imaged by an image-acquisition block 214. The image-acquisition block 214 can, optionally, be a single shot echo planar imaging (EPI) acquisition. Diffusion sensitizing gradients, Dx, Dy, and Dz, are applied to impart diffusion sensitivity during the acquisition block 214. Thereafter, additional slices can be rapidly acquired by repeating the RF excitation pulse 212' and imaging block 214' in the presence of the diffusion gradients, Dx, Dy, Dz.

Optionally, fat suppression pulses 216 can be played before the first RF pulse 14. Also, an inversion recovery pulse 218 can be applied at an optimal time before the first RF pulse 204 to achieve fat nulling at the time of the first RF pulse 204. This can be done either using frequency selective inversion or non-frequency selective inversion. The first RF pulse 204 can be a frequency selective excitation. The first RF pulse 204 and the third RF pulse 212 may also be cardiac triggered or gated, such that the diffusion gradients Dx, Dy, Dz, are applied at the same time in the cardiac cycle.

Reduced demand on gradient power can be used to enable advanced diffusion imaging on lower-end MRI systems with reduced gradient capability. The use of adiabatic pulses for RF excitation and fat suppression can also be advantageous utilized, for example, at high field, such as at 7 Tesla, where RF uniformity is poor. For example, the above-described pulse sequence can use adiabatic 90° pulses to reduce signal loss in regions with incorrect RF transmit field.

Thus, the pulse sequence 200 provides a non-selective STEAM preparation module 202 combined with a multi-slice acquisition module 203, which may be a fast multi-slice echo planar imaging acquisition or other acquisition. This provides the many benefits of STEAM pulse sequences, without the disadvantages for multi-slice and motion insensitive acquisitions.

The present disclosure further recognizes that the effects of the time spread on the diffusion signal and T1 weighting of the different slices can be readily corrected. In particular, these effects can be controlled by performing a second acquisition using the pulse sequence 200 with the slice order reversed compared to the preceding acquisition. Because both the diffusion weighting and the T1 decay are exponentially dependent on time after diffusion preparation, taking the geometric mean of the two sequential acquisitions corrects these effects while also providing the averaging effects of the two acquisitions to increase SNR. Thus, SNR degradation only occurs for acquisitions comparable to the T1 or diffusion prep time.

Thus, the above-described imaging process using the pulse sequence 200 presents substantial advantages of traditional attempts to use a stimulated echo (STEAM) pulse sequence for diffusion weighted imaging. For example, the systems and methods of the present disclosure deliver a diffusion-weighted imaging acquisition that includes fat suppression, cardiac motion effect reduction, RF transmit field robustness, reduced field of view, respiratory triggering, and longer diffusion times across a desired volume.

Non-Limiting Example

In one non-limiting example implementation, the above described pulse sequence 200 was implemented on a 3T scanner (GE MR750). A STEAM diffusion preparation module was performed that included of 2 nonselective 90° RF pulses (e.g., such as pulses 204 and 208 of FIG. 2) to initiate the preparation module. These pulses can, optionally, be made weakly selective (e.g., by applying gradients 206 and 210 of FIG. 2) to conveniently define reduced fields of view for the acquisition, if desired. Optional fat saturation (e.g., pulse 216) or spectrally selective or nonselective STIR fat suppression (e.g., pulse 218) pulses can be employed. Diffusion gradients were added between the two 90° RF pulses (e.g., such as pulses 204 and 208 of FIG. 2). In one non-limiting implementation, readout was achieved by applying a rapid series of gradient echo (GE), echo-planar acquisitions with the addition of diffusion and crusher gradients to refocus the stimulated echo.

In this construct, multiband RF pulses and reconstruction were readily supported. Because successive slices are acquired at different times, the change in mixing time (TM) results in a change of b-value and T1 decay. If uniformity of intensity is a priority or the number of slice excitations is large, correction of the decay can be achieved by acquiring two sets of images with acquisition order reversed, such as described above with respect to FIG. 2. Taking the geometric mean of the two images for each slice makes T1 and diffusion weighting uniform across slices.

Using the above described imaging strategies and pulse sequence, the systems and methods of the present disclosure were evaluated in phantoms and for brain imaging in two healthy volunteers. In this non-limiting example, b=1000 s/mm2 images were acquired with a diffusion time of 1 second and an isotropic spatial resolution of 2.5 mm. A TR of 3s was used. Two acquisition orders and 4 repetitions were performed. Both non-multiband, 8-slice acquisitions and 30-slice acquisitions with 6× multiband were acquired. Good image quality and successful compensation of differential diffusion and T1 weighting were achieved.

Thus, this example demonstrated that the use of a non-selective STEAM-based preparation module can be configured to overcome many of the challenges of traditional attempts to use STEAM-based pulse sequences in diffusion imaging across large volumes. The systems and methods of the present disclosure can be particularly advantageous, though is not in any way limited to, applications where long diffusion times, high diffusion weighting, gating to remove cardiac pulsations, improved fat suppression, reduced fields of view, and/or minimizing gradient duty cycles are needed.

Figure 3:
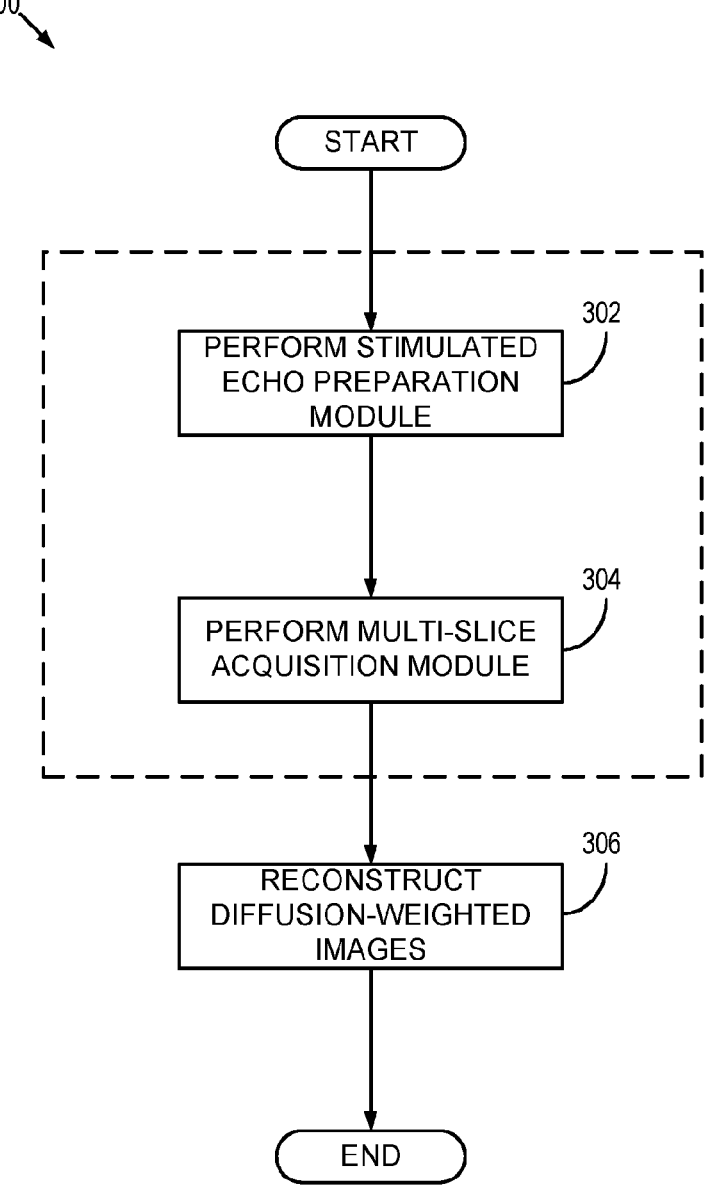
FIG. 3 is a flow chart setting forth one, non-limiting example of a process for producing diffusion-weighted images in accordance with the present disclosure.

Thus, referring to FIG. 3, a process or method 300 is provided for creating diffusion weighted images. In particular, at process block 302, a stimulated echo preparation module is performed, such as described above with respect to FIG. 2. The preparation module may include non-slice-selective radio-frequency (RF) pulses designed to induce a stimulated echo.

Then, at process block 304, a multi-slice acquisition module is performed to acquire MR data. As described, the acquisition module may include at least one multiband RF pulse for multiband acquisition of the MR data. The acquisition module can be performed with the diffusion gradients that are formed using a single first diffusion gradient for all slices of the multi-slice acquisition. The acquisition module can be repeated with a revised slice acquisition to acquire further MR data that forms at least one of a differential T1 or diffusion decay with the MR data. The revised slice acquisition can be a reversed slice order of that used to acquire the MR data. In this way, one may optionally take a geometric mean of the images produced from the MR data and the further MR data to reconstruct a corrected image with at least one of a corrected T1 or diffusion decay. In either case, whether further MR data is acquired at process block 306, at least the MR data can be reconstructed into diffusion weighted images.

Optionally, one may perform fat suppression to suppress fat artifacts in the MR data. The fat suppression can include a fat control pulse applied before the non-slice-selective RF pulses to control signal from fat. The fat control pulse can include at least one of (a) a frequency selective inversion pulse or non-frequency selective inversion pulse or (b) a fat saturation pulse. At least one of the RF pulses or fat suppression can include adiabatic pulses to control signal loss in regions with inconsistent RF transmit fields.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing diffusion-weighted images of a subject using a magnetic resonance imaging (MRI) system, the method comprising:
   performing a stimulated echo preparation module using non-slice-selective radio-frequency (RF) pulses designed to induce a stimulated echo;
   performing an acquisition module that includes a multi-slice acquisition of MR data in the presence of diffusion gradients; and
   reconstructing the diffusion-weighted images of the subject from the MR data.

2. A magnetic resonance imaging (MRI) system comprising:
   a magnet system configured to generate a static magnetic field ($B_0$) about at least a portion of a subject arranged in the MRI system;
   a plurality of gradient coils configured to apply magnetic gradients to the static magnetic field;
   a radio frequency (RF) system configured to apply an excitation field to the subject and acquire MR image data from the subject;
   a computer system programmed to:
      control the gradient coils and the RF system to:
         perform a stimulated echo preparation module using non-selective radio-frequency (RF) pulses designed to induce a stimulated echo;
         perform an acquisition module that includes a multi-slice acquisition of MR data in the presence of diffusion gradients; and
      reconstruct the diffusion-weighted images of the subject from the MR data.

3. The method of claim 1 wherein acquisition module includes at least one multiband RF pulse for multiband acquisition of the MR data.

4. The method of claim 1 wherein the acquisition module is repeated one or more times with one or more revised slice acquisition orders to acquire further MR data that produces at least one of a differential T1 or diffusion decay with the MR data.

5. The method of claim 1 further comprising performing fat suppression to suppress fat artifacts in the MR data.

6. The method of claim 1 further comprising applying a gradient during the non-slice-selective RF pulses to reduce an field of view (FOV) for the MR data.

7. The method of claim 1 wherein the acquisition module is gated to a cardiac cycle of the subject.

8. The method of claim 1 wherein acquisition module includes a diffusion-sensitized echo-planar pulse sequence.

9. The system of claim 2 wherein the computer system is further programmed to control the gradient coils and the RF system to repeat the acquisition module one or more times using one or more reordering of slices of the multi-slice acquisition to acquire further MR data.

10. The system of claim 2 wherein acquisition module includes at least one multiband RF pulse for multiband acquisition of the MR data.

11. The system of claim 2 wherein the computer system is further programmed to perform fat suppression to suppress fat artifacts in the MR data.

12. The system of claim 2 wherein the acquisition module is gated to a cardiac cycle of the subject.

13. The method of claim 4 wherein the revised slice acquisition is a reversed slice order of that used to acquire the MR data.

14. The method of claim 4 further comprising taking a mathematical combination of the MR data and the further MR data to produce a corrected image with at least one of a corrected T1 or diffusion decay.

15. The method of claim 5 wherein the fat suppression includes a fat control pulse applied before the non-slice-selective RF pulses to control signal from fat.

16. The method of claim 5 wherein at least one of the RF pulses and fat suppression includes adiabatic pulses to control signal loss in regions with inconsistent RF transmit fields.

17. The method of claim 8 wherein the diffusion-sensitized echo-planar pulse sequence is a gradient echo pulse sequence.

18. The system of claim 9 wherein the reordering includes a reversal of an order of slices used to acquire the MR data.

19. The system of claim 9 wherein the computer system is further configured to reconstruct the diffusion-weighted images by taking a mathematical combination of the MR data and the further MR data to produce a corrected image with at least one of a corrected T1 or diffusion decay relative to the images produced from the MR data.

20. The system of claim 11 wherein the fat suppression includes a fat control pulse applied before the non-selective RF pulses to control signal from fat.

21. The system of claim 11 wherein at least one of the RF pulses and fat suppression includes adiabatic pulses to control signal loss in regions with inconsistent RF transmit fields.

22. The method of claim 14 wherein the mathematical combination includes a geometric mean.

23. The method of claim 15 wherein the fat control pulse includes at least one of (a) a frequency selective inversion pulse or non-frequency selective inversion pulse or (b) a fat saturation pulse.

24. The system of claim 20 wherein the fat control pulse includes at least one of (a) a frequency selective inversion pulse or non-frequency selective inversion pulse or (b) a fat saturation pulse.

\* \* \* \* \*